(12) United States Patent
Lin et al.

(10) Patent No.: US 11,817,511 B2
(45) Date of Patent: Nov. 14, 2023

(54) POSITIVE ELECTRODE OF CRYSTALLINE SILICON SOLAR CELL HAVING GATE RUPTURE PREVENTION FUNCTION

(71) Applicants: Zhejiang Aiko Solar Energy Technology Co., Ltd., Zhejiang (CN); Guangdong Aiko Solar Energy Technology Co., Ltd., Guangdong (CN)

(72) Inventors: Kang-Cheng Lin, Zhejiang (CN); Mingzhang Feng, Zhejiang (CN); Jiebin Fang, Zhejiang (CN); Gang Chen, Zhejiang (CN)

(73) Assignees: Zhejiang Aiko Solar Energy Technology Co., Ltd., Zhejiang (CN); Guangdong Aiko Solar Energy Technology Co., Ltd., Guangdong (CN)

( * ) Notice: Subject to any disclaimer, the term of this patent is extended or adjusted under 35 U.S.C. 154(b) by 0 days.

(21) Appl. No.: 17/262,690

(22) PCT Filed: Jul. 23, 2019

(86) PCT No.: PCT/CN2019/097297
§ 371 (c)(1),
(2) Date: Mar. 23, 2021

(87) PCT Pub. No.: WO2020/020158
PCT Pub. Date: Jan. 30, 2020

(65) Prior Publication Data
US 2021/0399151 A1 Dec. 23, 2021

(30) Foreign Application Priority Data
Jul. 24, 2018 (CN) .......................... 201810816451.0

(51) Int. Cl.
*H01L 31/0224* (2006.01)
*H01L 31/068* (2012.01)

(52) U.S. Cl.
CPC .... *H01L 31/022433* (2013.01); *H01L 31/068* (2013.01)

(58) Field of Classification Search
CPC ..................... H01L 31/022433; H01L 31/068
See application file for complete search history.

(56) References Cited

U.S. PATENT DOCUMENTS

2009/0159116 A1* 6/2009 Umetani ............. H01L 31/0508
136/251
2013/0104956 A1* 5/2013 Chou .............. H01L 31/022433
136/244

(Continued)

FOREIGN PATENT DOCUMENTS

CN          202662616 U  *   1/2013
CN          203232876 U      10/2013

(Continued)

OTHER PUBLICATIONS

English machine translation of JP 2009-272405A. (Year: 2009).*

*Primary Examiner* — Ryan S Cannon
(74) *Attorney, Agent, or Firm* — Seed IP Law Group LLP

(57) ABSTRACT

Disclosed is a positive electrode of a crystalline silicon solar cell with a break-proof grid function, comprising a positive electrode busbar (1), a positive electrode grid (2), and a break-proof grid structure (3). The break-proof grid structure (3) and the positive electrode grid (2) are integrally printed and formed. The break-proof grid structure (3) is an octagon with a hollow-out groove (4) provided on its rear side. The break-proof grid structure (3) includes a rectangular grid segment (31) located in the middle, and two isosceles trapezoidal grid segments (32) that are located at both sides of the rectangular grid segment (31) and are provided symmetrically with the rectangular grid segment (31) as a center. The rectangular grid segment (31) spans the positive electrode busbar (1), and the left and right ends of (Continued)

the rectangular grid segment (31) extend out of the positive electrode busbar (1). The extended grid segment is a rectangular extensional break-proof grid segment (311). Both ends of the isosceles trapezoidal grid segment (32) respectively are in contact with the extensional break-proof grid segment (311) and the positive electrode grid (2). The hollow-out groove (4) is located within the isosceles trapezoidal grid segment (32) or spans the extensional break-proof grid segment (311) and the isosceles trapezoidal grid segment (32). A break-proof grid design in the positive electrode employs the combination of the octagon and the hollow-out groove, and can effectively reduce the probability of grid breakage when the front-side electrode is printed.

8 Claims, 4 Drawing Sheets

(56) References Cited

U.S. PATENT DOCUMENTS

| | | | |
|---|---|---|---|
| 2015/0007865 A1* | 1/2015 | Steckemetz | H01L 31/0504 |
| | | | 136/244 |
| 2015/0263194 A1* | 9/2015 | Tsujimoto | H01L 31/022433 |
| | | | 136/256 |
| 2016/0322512 A1 | 11/2016 | Nagase et al. | |
| 2016/0322513 A1* | 11/2016 | Martin | H01L 31/022433 |
| 2017/0162722 A1 | 6/2017 | Fu et al. | |
| 2019/0035952 A1* | 1/2019 | Sato | H01L 31/022433 |

FOREIGN PATENT DOCUMENTS

| | | | | |
|---|---|---|---|---|
| CN | 203232878 U | * | 10/2013 | |
| CN | 203277398 U | | 11/2013 | |
| CN | 203932074 U | | 11/2014 | |
| CN | 106252427 A | * | 12/2016 | H01L 31/022433 |
| CN | 206907780 U | | 1/2018 | |
| CN | 109037363 A | | 12/2018 | |
| CN | 208637429 U | | 3/2019 | |
| EP | 2 669 953 A1 | | 4/2013 | |
| JP | 2009-272405 A | | 11/2009 | |
| JP | 2012156459 A | | 8/2012 | |
| KR | 10-2013-0012134 A | | 2/2013 | |
| WO | WO-2013136436 A1 | * | 9/2013 | H01L 31/022433 |
| WO | 2013/076861 A1 | | 4/2015 | |
| WO | WO 2017168474 A1 | | 10/2017 | |

\* cited by examiner

POSITIVE ELECTRODE OF CRYSTALLINE SILICON SOLAR CELL HAVING GATE RUPTURE PREVENTION FUNCTION

FIELD

The present disclosure relates to a solar cell structure, and specifically to a positive electrode of a crystalline silicon solar cell with a break-proof grid function.

BACKGROUND

The positive electrode of the crystalline silicon solar cell is designed to include a busbar and a grid perpendicular to the busbar. The function of a grid line is to collect a photo-generated current to a busbar line. If a breakage and a false printing of the grid line occurs upon printing, the collection of the photo-generated current will be affected and the cell efficiency will be affected. If a cell piece with a grid broken is used to make a module, a hot spot of local heating will appear at the broken grid, which will affect the service life of the module.

There are many reasons for grid breakage upon solar cell printing. The following reasons will all cause grid breakage to different degrees: screen parameters are not set correctly, a line width of the screen printing plate does not match the paste, the screen printing plate is blocked, the scraper is worn, the viscosity of the paste is excessively high or the paste becomes dry, score lines on silicon wafer, and so on. When the scraper passes by the busbar to a juncture of the busbar and the grid upon screen printing, since ink penetration amount drops rapidly, the printing height of the grid line falls accordingly, which also causes a certain proportion of grid breakage. In view of this case, such a problem of grid breakage is typically addressed by adding a trapezoidal break-proof grid of a certain width at the connection of the busbar and the grid.

A conventional break-proof grid design may be used to reduce the probability of grid breakage when the printing is performed on the front side of the cell, but a proportion of the grid breakage caused by the conventional design has already failed to satisfy the demands in the market as the modules have increasingly high requirements for the cell quality. Hence, a more reasonable and practical design is needed to reduce the proportion of the grid breakage.

SUMMARY

An object of the present disclosure is to provide a positive electrode of a crystalline silicon solar cell with a break-proof grid function, and a crystalline silicon solar cell including the positive electrode. The break-proof grid design in the positive electrode employs an octagon in combination with a hollow-out groove, and may effectively reduce the probability of grid breakage when the front-side electrode is printed. The function of reducing a hot spot effect of local heating in the module can be achieved by preventing grid breakage.

According to the present disclosure, there is provided a crystalline silicon solar cell, comprising a positive electrode, the positive electrode including a positive electrode busbar, a positive electrode grid, and a break-proof grid structure. The positive electrode grid and the break-proof grid structure are integrally printed and formed. A portion of the break-proof grid structure between the positive electrode busbar and positive electrode grid includes at least one hollow-out groove. The positive electrode of the present disclosure has a break-proof grid design which includes the hollow-out groove. When a scraper passes by the busbar to the hollow-out region upon printing, the height of the break-proof grid region may be made increase, thereby effectively reducing the probability of grid breakage when the front-side electrode is printed, ensuring that the grid line collects photo-generated carriers to a maximum extent, and improving the efficiency of the cell.

In some embodiments, the break-proof grid structure is an octagon provided with at least one hollow-out groove. The octagon includes a rectangular grid segment located in the middle and two isosceles trapezoidal grid segments that are located at both sides of the rectangular grid segment and are provided symmetrically with the rectangular grid segment as a center. The rectangular grid segment spans the positive electrode busbar, and left and right ends of the rectangular grid segment extend out of the positive electrode busbar. The extended grid segment is a rectangular extensional break-proof grid segment. Both ends of the isosceles trapezoidal grid segment are respectively in contact with the extensional break-proof grid segment and the positive electrode grid. The isosceles trapezoidal grid segment is a tapered grid segment with a cross section gradually reducing in a direction from the positive electrode busbar to the positive electrode grid. The hollow-out groove is located within the isosceles trapezoidal grid segment or spans the extensional break-proof grid segment and the isosceles trapezoidal grid segment.

In such an embodiment, the break-proof grid design is a combination of the octagon and the hollow-out groove. The octagon is widened and lengthened and connects the busbar with the grid, and functions to provide sufficient buffer upon printing. The hollow-out design is superimposed at the octagonal break-proof grid along the printing direction. When the scraper passes by the busbar to the hollow-out region upon printing, the height of the break-proof grid region may be made increase, thereby effectively reducing the probability of grid breakage when the front-side electrode is printed, ensuring that the grid line collects photo-generated carriers to a maximum extent, and improving the efficiency of the cell. Meanwhile, since a cell piece with a grid broken is used to make a module, a hot spot effect of the module will increase. By preventing the grid breakage, the present disclosure achieves a function of reducing the hot spot effect of local heating of the module.

In some embodiments, the at least one hollow-out groove is arranged in a lengthwise direction of the positive electrode grid. Alternatively, the at least one hollow-out groove is arranged in a direction perpendicular to the lengthwise direction of the positive electrode grid.

In some embodiments, a total length of the break-proof grid structure is in a range of 1-4 mm. In one example, the total length L1 of the break-proof grid structure is in a range of 2.4-3.4 mm. A width W1 of the extensional break-proof grid segment is in a range of 0.062-0.520 mm, particularly in a range of 0.050-0.090 mm, the same as that of the rectangular grid segment. A length L2 of the extensional break-proof grid segment is in a range of 0.016-0.026 mm. A width of an end of the isosceles trapezoidal grid segment in contact with the extensional break-proof grid segment is the same as that of the extensional break-proof grid segment. A width W2 of an end of the isosceles trapezoidal grid segment in contact with the positive electrode grid is in a range of 0.015-0.050 mm, particularly in a range of 0.025-0.050 mm, the same as that of the positive electrode grid.

In the octagonal break-proof grid design, the width of a connection of the busbar and the grid is in a range of 0.050-0.090 mm, and the width is retained and extended outward to a location that is in a range of 0.016-0.026 mm from the edge of the busbar. The function of the design is to, on the one hand, prevent the rapid drop of the ink penetration amount at the connection of the busbar and the grid from causing reduction of the height, and on the other hand, reserve a sufficient space above and below the hollow-out to prevent the grid breakage caused by the too small region above and below the hollow-out. The total length of the octagonal break-proof grid design is in a range of 2.4-3.3 mm. Compared with the conventional break-proof grid design, the break-proof grid is lengthened on the whole. The design functions to provide sufficient buffer when printing is performed.

In some embodiments, the hollow-out groove is a rectangle or circle. The length and width of the rectangle is selected from a range of 0.028-0.078 mm, a diameter of the circle is in a range of 0.028-0.078 mm, and a distance between a center of the hollow-out groove and an edge of the positive electrode busbar is in a range of 0.033-0.068 mm.

In one example, the hollow-out groove is a square hole, a side length of the hollow-out groove is in a range of 0.034-0.084 mm, and the distance between the center of the hollow-out groove and the edge of the positive electrode busbar is in a range of 0.033-0.068 mm.

The square hollow-out design may further improve the break-proof grid effect at the connection of the busbar and the grid. The square hollow-out design has a side length with a size in a range of 0.034-0.084 mm, and it functions in a way that when the scraper passes by the square hollow-out region upon printing, the height of the break-proof grid region slowly rises along the printing direction, thereby further enhancing the break-proof grid effect.

As compared with the prior art, the positive electrode of the present disclosure can effectively reduce the probability of grid breakage when the front-side electrode is printed, ensure that the grid line collects photo-generated carriers to a maximum extent, and improve the efficiency of the cell. At the same time, since a cell piece with a grid broken is used to make a module, the hot spot effect of the module will increase. By preventing the grid breakage, the present disclosure achieves a function of reducing the hot spot effect of local heating of the module. Moreover, the present disclosure may be employed to effectively reduce the hot spot effect of local heating of the module and improve the service life of the module. The present disclosure is simple in structural design and has a wide scope of application.

BRIEF DESCRIPTION OF THE DRAWINGS

The present disclosure will be described in more detail hereinafter with reference to figures and specific embodiments.

Figure 1:
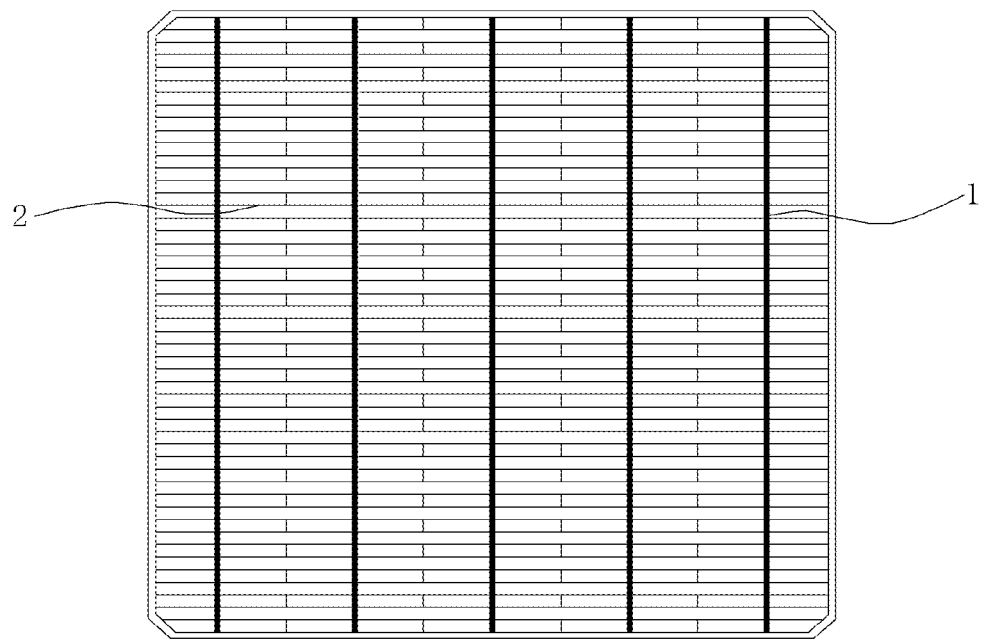
FIG. 1 is a front view of a crystalline silicon solar cell including a positive electrode according to the present disclosure.
Figure 2:
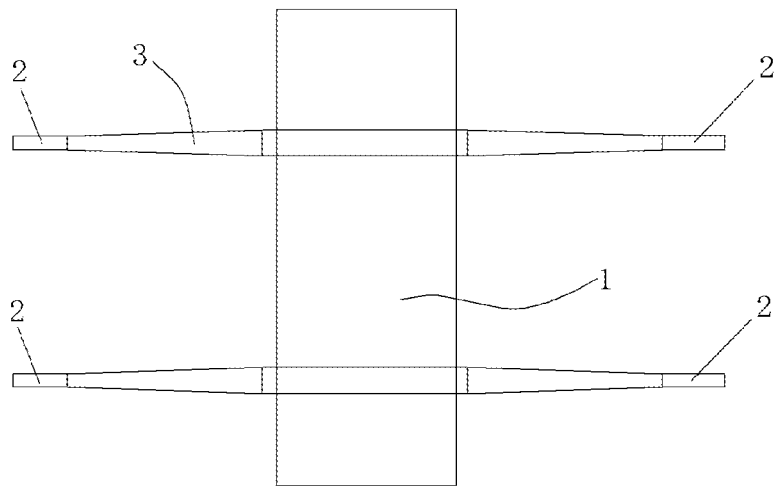
FIG. 2 is a structural schematic view of a front side of the positive electrode of the crystalline silicon solar cell with a break-proof grid function according to the present disclosure.
Figure 3:
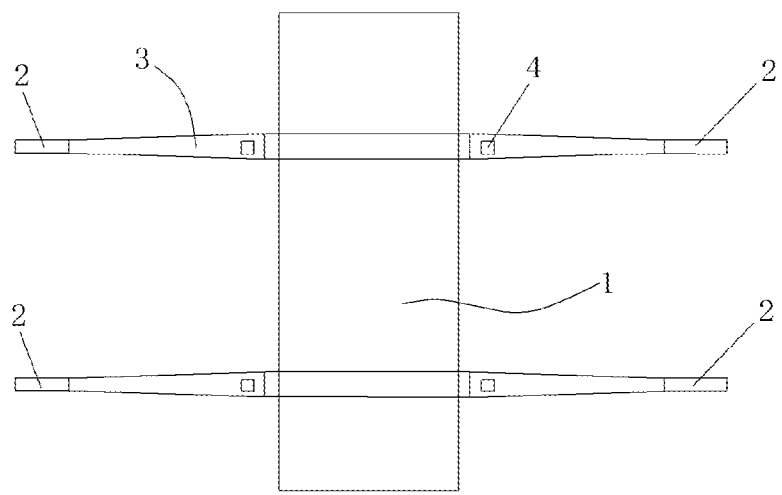
FIG. 3 is a structural schematic view of a rear side of the positive electrode of the crystalline silicon solar cell with a break-proof grid function according to the present disclosure.
Figure 4:
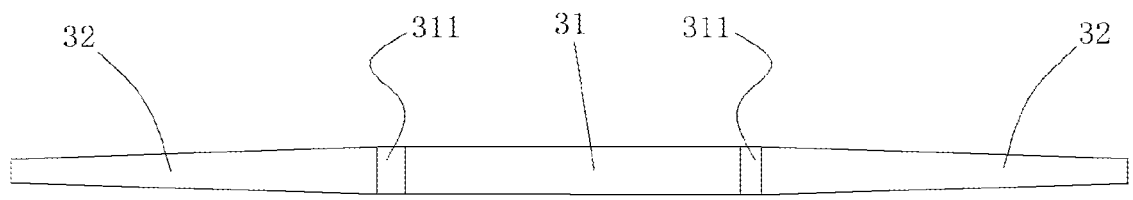
FIG. 4 is a structural schematic view of a front side of a break-proof grid structure in the positive electrode of the crystalline silicon solar cell with a break-proof grid function according to the present disclosure.
Figure 5:
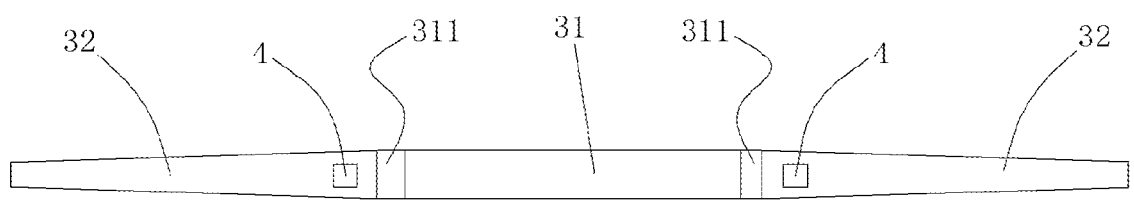
FIG. 5 is a structural schematic view of a rear side of the break-proof grid structure in the positive electrode of the crystalline silicon solar cell with a break-proof grid function according to the present disclosure.
Figure 6:
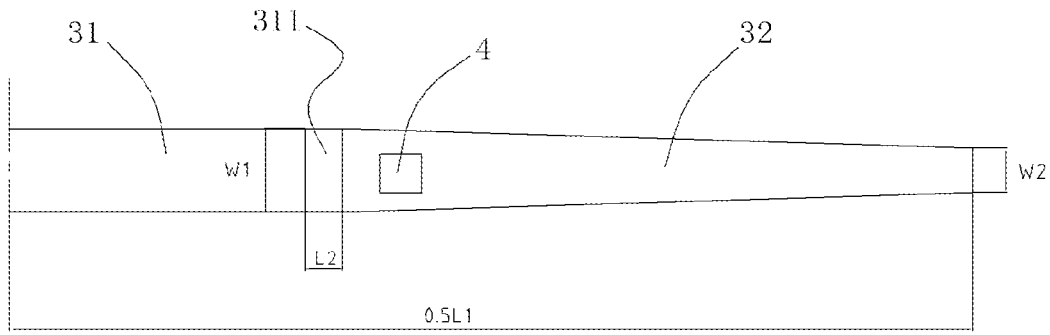
FIG. 6 is a structural schematic view of a rear side of a half of the break-proof grid structure in the positive electrode of the crystalline silicon solar cell with a break-proof grid function according to the present disclosure.

PARTS DENOTED BY REFERENCE NUMBERS 1 positive electrode busbar, 2 positive electrode grid, 3 break-proof grid structure, 31 rectangular grid segment, 311 extensional break-proof grid segment, 32 isosceles trapezoidal grid segment, 4 hollow-out groove, 5 busbar region, 6 break-proof grid region without hollow-out groove superimposed, 7 break-proof grid region with hollow-out groove superimposed.

DETAILED DESCRIPTION

A positive electrode of a crystalline silicon solar cell with a break-proof grid function as shown in FIGS. 1-7 includes a positive electrode busbar 1, a positive electrode grid 2, and a break-proof grid structure 3. The break-proof grid structure 3 and the positive electrode grid 2 are integrally printed and formed. The break-proof grid structure 3 is an octagon with at least one hollow-out groove 4 provided on its rear side. The break-proof grid structure 3 includes a rectangular grid segment 31 located in the middle and two isosceles trapezoidal grid segments 32 that are located at both sides of the rectangular grid segment 31 and are provided symmetrically with the rectangular grid segment 31 as a center. The rectangular grid segment 31 spans the positive electrode busbar 1, and left and right ends of the rectangular grid segment 31 extend out of the positive electrode busbar 1. The extended grid segment is a rectangular extensional break-proof grid segment 311. Both ends of the isosceles trapezoidal grid segment 32 are respectively in contact with the extensional break-proof grid segment 311 and the positive electrode grid 2. The isosceles trapezoidal grid segment 32 is a tapered grid segment with a cross section gradually reducing in a direction from the positive electrode busbar 1 to the positive electrode grid 2. The hollow-out groove 4 spans the extensional break-proof grid segment 311 and the isosceles trapezoidal grid segment 32.

In some embodiments, there are a plurality of hollow-out grooves 4, and the plurality of hollow-out grooves 4 are arranged in a lengthwise direction of the positive electrode grid 2. In some embodiments, the plurality of hollow-out grooves 4 are arranged in a direction perpendicular to the lengthwise direction of the positive electrode grid 2.

In the present embodiment, a total length L1 of the break-proof grid structure 3 is in a range of 1-4 mm, particularly in a range of 2.4-3.4 mm. A width W1 of the extensional break-proof grid segment 311 is 0.080 mm, the same as that of the rectangular grid segment 31. A length L2 of the extensional break-proof grid segment 311 is 0.022 mm. A width of an end of the isosceles trapezoidal grid segment 32 in contact with the extensional break-proof grid segment 311 is the same as that of the extensional break-proof grid segment 311. A width W2 of an end of the isosceles trapezoidal grid segment 32 in contact with the positive electrode grid 2 is 0.034 mm, the same as the width of the positive electrode grid 2.

The hollow-out groove 4 is a square hole. The side length of the hollow-out groove 4 is 0.050 mm. A distance between the center of the hollow-out groove 4 and the edge of the positive electrode busbar 1 is 0.038 mm. At this time, the hollow-out groove 4 spans the extensional break-proof grid segment 311 and the isosceles trapezoidal grid segment 32. The hollow-out groove 4 may also have other shapes such as a rectangle, a circle, an ellipse, and the like.

As a variation of the present embodiment, the total length L1 of the break-proof grid structure 3 may also be a value selected from a range of 1-4 mm (particularly, a range of 2.4-3.4 mm). The width W1 of the extensional break-proof grid segment 311 may also be a value selected from a range of 0.062-0.520 mm. The length L2 of the extensional break-proof grid segment 311 may also be a value selected from a range of 0.016-0.026 mm. The width of the positive electrode grid 2 may also be a value selected from a range of 0.015-0.050 mm (particularly, a range of 0.025-0.050 mm). The side length of the hollow-out groove 4 may also be a value selected from a range of 0.034-0.084 mm. The distance between the center of the hollow-out groove 4 and the edge of the positive electrode busbar 1 may also be a value selected from a range of 0.033-0.068 mm. When the hollow-out groove 4 is rectangular, the values of its length and width are selected from a range of 0.028-0.078 mm. When the hollow-out groove 4 is circular, its diameter is in a range of 0.028-0.078 mm. Therefore, the hollow-out groove 4 may also be located only within the isosceles trapezoidal grid segment 32. That is, the hollow-out groove 4 may be provided within the isosceles trapezoidal grid segment 32, or it may span the extensional break-proof grid segment 311 and the isosceles trapezoidal grid segment 32.

A process of forming the hollow-out groove 4 in the present disclosure is as follows: when a screen printing plate is designed for the solar cell, a protruding square photosensitive emulsion is added at a position of the screen printing plate corresponding to the hollow-out groove of the break-proof grid structure, to make the break-proof grid structure hollow-out. When the positive electrode is printed in reality, the hollow-out groove 4 is formed on the rear side of the break-proof grid structure 3.

The break-proof grid structure 3 of the solar cell of the present disclosure is designed to be a combination of an octagonal shape and a square hollow-out. The width W1 of the extensional break-proof grid segment is also the width of the connection between the positive electrode busbar 1 and the positive electrode grid 2, and is preferably in a range of 0.050-0.090 mm. The length L2 of the extensional break-proof grid segment 311 is also the distance of the extensional break-proof grid segment 311 from the edge of the positive electrode busbar 1, and is preferably in a range of 0.016-0.026 mm, and the square hollow-out groove 4 is provided. The function of the design is to, on the one hand, prevent the rapid drop of the ink penetration amount at the connection of the busbar and the grid from causing reduction of the height, and on the other hand, reserve a sufficient space above and below the square hollow-out groove 4 to prevent the grid breakage caused by the too small region above and below the square hollow-out. The total length L1 of the break-proof grid structure 3 is in a range of 1-4 mm (particularly, in a range of 2.4-3.4 mm). Compared with the conventional break-proof grid design, the break-proof grid is lengthened on the whole. The design functions to provide sufficient buffer when printing is performed. The design of the hollow-out groove 4 may further improve the break-proof grid effect at the connection of the busbar and the grid, and play a reinforcing role.

Figure 7:
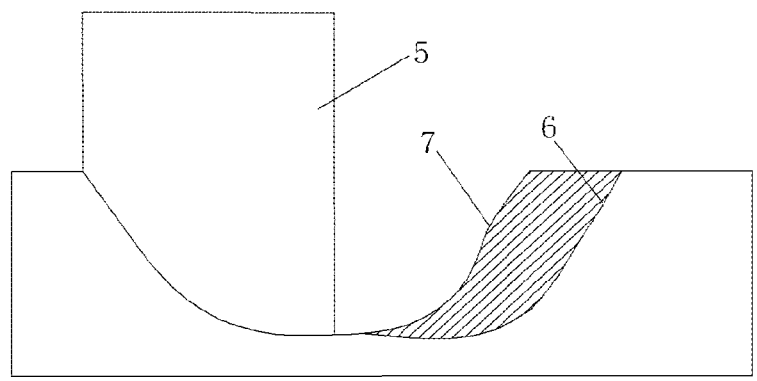
FIG. 7 is a schematic view showing a change of height of a square hollow-out region in the positive electrode of the crystalline silicon solar cell with a break-proof grid function according to the present disclosure before and after printing.

In the present disclosure, the size of the side length of the square hollow-out groove 4 is in a range of 0.034-0.084 mm. The functional principle of the hollow-out groove 4 is shown in FIG. 7. When the scraper passes by the busbar region 5 upon printing, the corresponding printing height of the paste gradually reduces until the printing enters the break-proof grid region 6 without the hollow-out groove superimposed, and the printing height gradually increases; and when the printing enters the break-proof grid region 7 with the hollow-out groove superimposed, the printing height rises rapidly, thereby further enhancing the break-proof grid effect.

Therefore, the present disclosure may effectively reduce the probability of grid breakage when the front-side electrode is printed, ensure that the grid line collects photo-generated carriers to a maximum extent, and improve the efficiency of the cell. At the same time, since a cell piece with a grid broken is used to make a module, a hot spot effect of the module will increase. By preventing the grid breakage, the present disclosure achieves a function of reducing the hot spot effect of local heating of the module and improves the service life of the module. The present disclosure is simple in structural design and has a wide scope of application.

The above-mentioned embodiments of the present disclosure are not intended to limit the scope of protection of the present disclosure, and the embodiments of the present disclosure are not limited thereto. Other various modifications, substitutes or variations to the above structures of the present disclosure, according to the above content of the present disclosure as well as ordinary technical knowledge and customary means in the art, without departing from the above basic technical ideas of the present disclosure, should all fall within the protection scope of the present disclosure.

We claim:

1. A crystalline silicon solar cell, comprising a positive electrode, the positive electrode including a positive electrode busbar, a positive electrode grid, and a break-proof grid structure that prevents the positive electrode grid from breaking upon printing, the positive electrode grid and the break-proof grid structure being integrally printed and formed, wherein a portion of the break-proof grid structure between the positive electrode busbar and positive electrode grid includes at least one hollow-out groove, wherein the break-proof grid structure is an octagon, the octagon includes a rectangular grid segment located in the middle and two isosceles trapezoidal grid segments that are located at both sides of the rectangular grid segment and are provided symmetrically with the rectangular grid segment as a center, the rectangular grid segment spans the positive electrode busbar, and left and right ends of the rectangular grid segment extend out of the positive electrode busbar to form extended grid segments, each of the extended grid segments is a rectangular extensional break-proof grid segment, both ends of each isosceles trapezoidal grid segment are respectively in contact with the extensional break-proof grid segment and the positive electrode grid, each isosceles trapezoidal grid segment is a tapered grid segment with a cross section gradually reducing in a direction from the positive electrode busbar to the positive electrode grid, and the at least one hollow-out groove is located only within the isosceles trapezoidal grid segment.

2. The crystalline silicon solar cell according to claim 1, wherein the at least one hollow-out groove is arranged in a lengthwise direction of the positive electrode grid.

3. The crystalline silicon solar cell according to claim 1, wherein the at least one hollow-out groove is arranged in a direction perpendicular to a lengthwise direction of the positive electrode grid.

4. The crystalline silicon solar cell according to claim 1, wherein a total length (L1) of the break-proof grid structure is in a range of 1-4 mm.

5. The crystalline silicon solar cell according to claim 1, wherein a width (W1) of the extensional break-proof grid segment is in a range of 0.062-0.520 mm, the same as that of the rectangular grid segment, and a length of the extensional break-proof grid segment is in a range of 0.016-0.026 mm.

6. The crystalline silicon solar cell according to claim 1, wherein a width of an end of each isosceles trapezoidal grid segment in contact with the extensional break-proof grid segment is the same as that of the extensional break-proof grid segment, and a width (W2) of an end of each isosceles trapezoidal grid segment in contact with the positive electrode grid is in a range of 0.015-0.050 mm, the same as that of the positive electrode grid.

7. The crystalline silicon solar cell according to claim 1, wherein the at least one hollow-out groove is a rectangle or circle.

8. The crystalline silicon solar cell according to claim 7, wherein a length and width of the rectangle is selected from a range of 0.028-0.078 mm, a diameter of the circle is in a range of 0.028-0.078 mm, and a distance between a center of the at least one hollow-out groove and an edge of the positive electrode busbar is in a range of 0.033-0.068 mm.

* * * * *